(12) United States Patent
Jean et al.

(10) Patent No.: US 10,134,949 B2
(45) Date of Patent: Nov. 20, 2018

(54) SEMICONDUCTOR LIGHT EMITTING DEVICE

(71) Applicant: SAMSUNG ELECTRONICS CO., LTD., Suwon-si, Gyeonggi-do (KR)

(72) Inventors: Jai Won Jean, Seoul (KR); Min Ho Kim, Hwaseong-si (KR); Min Hwan Kim, Ansan-si (KR); Jang Mi Kim, Hwaseong-si (KR); Chul Min Kim, Gunpo-si (KR); Jeong Wook Lee, Yongin-si (KR); Jae Deok Jeong, Suwon-si (KR); Yong Seok Choi, Suwon-si (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/678,462

(22) Filed: Aug. 16, 2017

(65) Prior Publication Data
US 2018/0198019 A1    Jul. 12, 2018

(30) Foreign Application Priority Data

Jan. 11, 2017    (KR) .......................... 10-2017-0004263

(51) Int. Cl.
*H01L 33/06*    (2010.01)
*H01L 33/32*    (2010.01)
(Continued)

(52) U.S. Cl.
CPC .......... *H01L 33/06* (2013.01); *H01L 33/0025* (2013.01); *H01L 33/325* (2013.01); *H01L 33/12* (2013.01)

(58) Field of Classification Search
CPC ..... H01L 33/06; H01L 33/0025; H01L 33/25; H01L 33/12
See application file for complete search history.

(56) References Cited

U.S. PATENT DOCUMENTS 6,372,608 B1    4/2002    Shimoda et al.
6,645,830 B2    11/2003    Shimoda et al.
(Continued)

FOREIGN PATENT DOCUMENTS

KR    10-0482511 B1    4/2005

*Primary Examiner* — Phuc Dang
(74) *Attorney, Agent, or Firm* — Lee & Morse, P.C.

(57) ABSTRACT

A semiconductor light emitting device including a first conductivity-type semiconductor layer; a second conductivity-type semiconductor layer; an active layer interposed between the first conductivity-type semiconductor layer and the second conductivity-type semiconductor layer, the active layer including at least one quantum well layer and at least one quantum barrier layer that are alternately stacked and form a multiple quantum well structure; at least one border layer in contact with the first conductivity-type semiconductor layer and interposed between the first conductivity-type semiconductor layer and the active layer, the at least one border layer having a band gap energy that decreases in a direction away from the first conductivity-type semiconductor layer; and at least one growth blocking layer interposed between the active layer and the border layer, the at least one growth blocking layer having a band gap energy equal to a band gap energy of the at least one quantum barrier layer.

19 Claims, 7 Drawing Sheets

(51) Int. Cl.
  *H01L 33/00* (2010.01)
  *H01L 33/12* (2010.01)

(56) References Cited

U.S. PATENT DOCUMENTS

| | | |
|---|---|---|
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,008,683 B2 | 8/2011 | Choi et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 2008/0149917 A1 | 6/2008 | Park |
| 2015/0349197 A1* | 12/2015 | Watanabe ............ H01L 33/025 257/13 |
| 2016/0043279 A1* | 2/2016 | Jean ..................... H01L 33/325 257/13 |
| 2017/0186912 A1* | 6/2017 | Inoue ................... H01L 33/32 |

* cited by examiner

SEMICONDUCTOR LIGHT EMITTING DEVICE

CROSS-REFERENCE TO RELATED APPLICATION

Korean Patent Application No. 10-2017-0004263, filed on Jan. 11, 2017, in the Korean Intellectual Property Office, and entitled: "Semiconductor Light Emitting Device," is incorporated by reference herein in its entirety.

BACKGROUND

1. Field

Embodiments relate to a semiconductor light emitting device.

2. Description of the Related Art

Semiconductor light emitting devices are semiconductor devices generating light of various colors in such a manner that, when an electric current is applied thereto, an electron is recombined with a hole at an interface of a first conductivity-type semiconductor and a second conductivity-type semiconductor. The semiconductor light emitting devices described above have various advantages, such as having a long lifespan, requiring a low level of power, having excellent initial driving characteristics, and the like, compared to light emitting devices based on a filament. Thus, demand for semiconductor light emitting devices has constantly been increasing. Recently, group III nitride semiconductors emitting blue light having a short wavelength have drawn interest.

SUMMARY

The embodiments may be realized by providing a semiconductor light emitting device including a first conductivity-type semiconductor layer; a second conductivity-type semiconductor layer; an active layer interposed between the first conductivity-type semiconductor layer and the second conductivity-type semiconductor layer, the active layer including at least one quantum well layer and at least one quantum barrier layer that are alternately stacked and form a multiple quantum well structure; at least one border layer in contact with the first conductivity-type semiconductor layer and interposed between the first conductivity-type semiconductor layer and the active layer, the at least one border layer having a band gap energy that decreases in a direction away from the first conductivity-type semiconductor layer; and at least one growth blocking layer interposed between the active layer and the border layer, the at least one growth blocking layer having a band gap energy equal to a band gap energy of the at least one quantum barrier layer.

The embodiments may be realized by providing a semiconductor light emitting device including a substrate; a first conductivity-type semiconductor layer, an active layer, and a second conductivity-type semiconductor layer, stacked on the substrate; a border layer interposed between the first conductivity-type semiconductor layer and the active layer, the border layer having a band gap energy that decreases in a direction away from the first conductivity-type semiconductor layer and including $Al_xIn_yGa_{1-x-y}N$, in which $0 \le x \le 0.1$ and $0.01 \le y \le 0.1$; and a growth blocking layer interposed between the border layer and the active layer and including $Al_xGa_{1-x}N$, in which $0 \le x < 1$.

The embodiments may be realized by providing a semiconductor light emitting device including a first conductivity-type semiconductor layer; a second conductivity-type semiconductor layer; an active layer interposed between the first conductivity-type semiconductor layer and the second conductivity-type semiconductor layer, the active layer including at least one indium-containing quantum well layer and at least one quantum barrier layer that are alternately stacked; an indium-containing border layer in contact with the first conductivity-type semiconductor layer; and a GaN-containing growth blocking layer contacting the active layer and the border layer.

BRIEF DESCRIPTION OF DRAWINGS

Features will be apparent to those of skill in the art by describing in detail exemplary embodiments with reference to the attached drawings in which.

DETAILED DESCRIPTION

Figure 1:
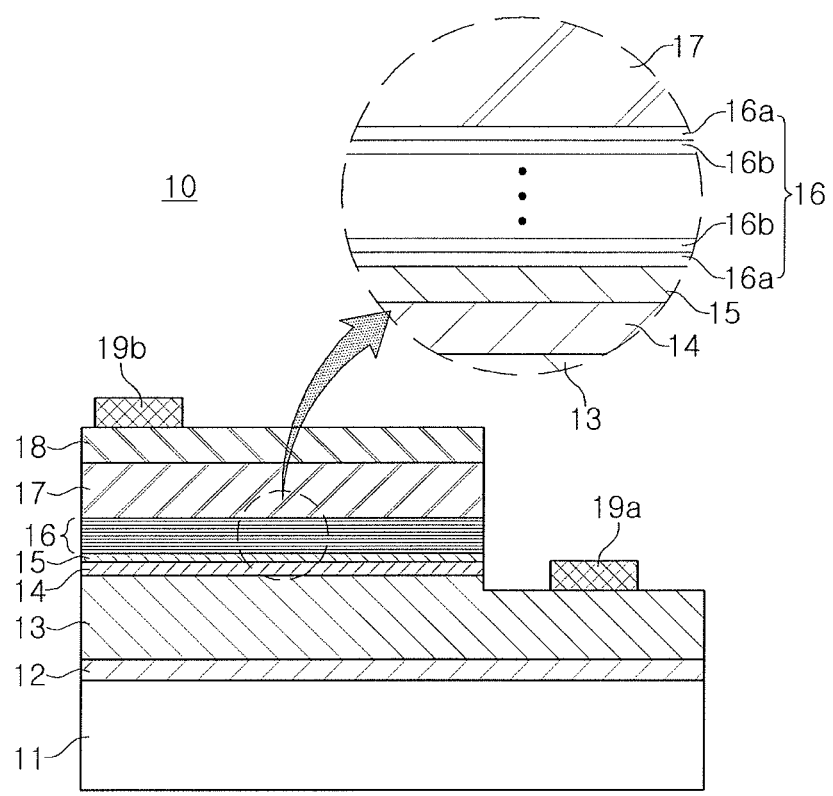
FIG. 1 illustrates a cross-sectional view of a semiconductor light emitting device according to an example embodiment of the present disclosure.

FIG. 1 illustrates a cross-sectional view of a semiconductor light emitting device according to an example embodiment of the present disclosure.

With reference to FIG. 1, a semiconductor light emitting device 10 may include a first conductivity-type semiconductor layer 13, an active layer 16 (having a multiple quantum well structure), and a second conductivity-type semiconductor layer 17, sequentially disposed on a substrate 11. The semiconductor light emitting device 10 may include a border layer 14 (interposed between the first conductivity-type semiconductor layer 13 and the active layer 16) and a growth blocking layer 15 (interposed between the border layer 14 and the active layer 16).

The substrate 11 may be a semiconductor growth substrate including, e.g., sapphire, silicon carbide (SiC), magnesium aluminate ($MgAl_2O_4$), magnesium oxide (MgO), lithium aluminate ($LiAlO_2$), lithium gallate ($LiGaO_2$), gallium nitride (GaN), or the like. For example, sapphire is a crystal having Hexa-Rhombo R3c symmetry, has lattice constants of 13.00 Å and 4.758 Å in directions of a c-axis and an a-axis, respectively, and includes a C (0001) plane, an A (11-20) plane, an R (1-102) plane, and the like. In an implementation, a nitride thin film may be relatively easily grown on the C plane, which is stable at relatively high temperatures, and the C plane may be commonly used for a nitride growth substrate.

The substrate 11 may include surfaces opposing each other, and a concave-convex structure may be formed on at least one of the opposing surfaces thereof. The concave-convex structure may be provided by etching a portion of the substrate 11 or by forming a hetero material layer, different from the substrate 11.

A buffer layer 12 may be interposed between the substrate 11 and the first conductivity-type semiconductor layer 13. The buffer layer 12 may include, e.g., $Al_xIn_yGa_{1-x-y}N$ (in which $0 \leq x \leq 1$ and $0 \leq y \leq 1$). In an implementation, the buffer layer 12 may include, e.g., AlN, AlGaN, or InGaN. In an implementation, the buffer layer 12 may be formed by combining a plurality of layers or by gradually changing a composition thereof. The buffer layer 12 may be interposed between the first conductivity-type semiconductor layer 13 and the substrate 11 and may help ease stress applied to the first conductivity-type semiconductor layer 13, thereby improving crystallinity.

The first conductivity-type semiconductor layer 13 may include a nitride semiconductor, e.g., n-type $Al_xIn_yGa_{1-x-y}N$ ($0 \leq x < 1$, $0 \leq y < 1$, $0 \leq x+y < 1$) and an n-type impurity may include silicon (Si). The second conductivity-type semiconductor layer 17 may include, e.g., p-type $Al_xIn_yGa_{1-x-y}N$ ($0 \leq x < 1$, $0 \leq y < 1$, $0 \leq x+y < 1$) and a p-type impurity may include magnesium (Mg). For example, the first conductivity-type semiconductor layer 13 may include n-type GaN, and the second conductivity-type semiconductor layer 17 may include p-type GaN. In an implementation, the second conductivity-type semiconductor layer 17 may have a single layer structure. In an implementation, the second conductivity-type semiconductor layer 17 may have a multilayer structure including layers having different compositions.

In an implementation, the active layer 16 may have a multiple quantum well (MQW) structure in which a quantum well layer 16a and a quantum barrier layer 16b are alternately stacked. For example, the quantum well layer 16a and the quantum barrier layer 16b may each independently include $Al_xIn_yGa_{1-x-y}N$ ($0 \leq x \leq 1$, $0 \leq y \leq 1$, $0 \leq x+y \leq 1$) having different compositions. In an implementation, the quantum well layer 16a may contain an element, e.g., indium (In), having high volatility. In an implementation, the quantum well layer 16a may include, e.g., $In_xGa_{1-x}N$ (in which $0 < x \leq 1$), and the quantum barrier layer 16b may include, e.g., GaN or AlGaN.

Figure 2:
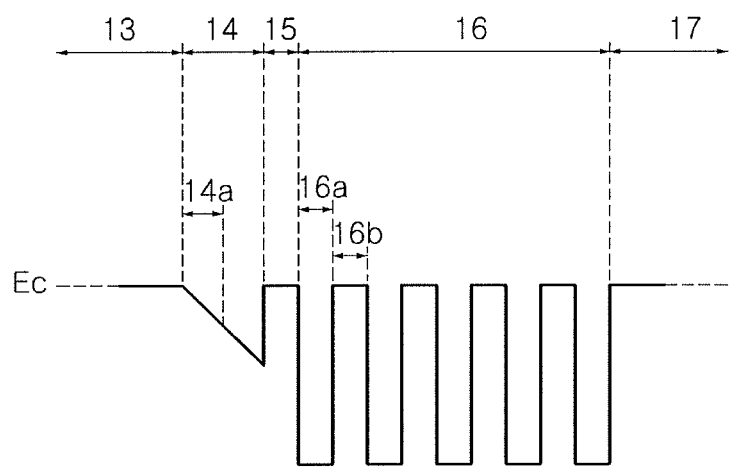
FIG. 2 illustrates an energy band diagram of energy bands encircling an active layer of a semiconductor light emitting device according to an example embodiment.

FIG. 2 illustrates an energy band diagram showing energy bands encircling an active layer 16 of a semiconductor light emitting device according to an example embodiment. FIG. 2 illustrates the energy band diagram of five quantum well layers 16a, five quantum barrier layers 16b (having a band gap energy greater than that of the quantum well layer 16a), a border layer 14 (in contact with the first conductivity-type semiconductor layer 13), and a growth blocking layer 15 (between the border layer 14 and the quantum well layer 16a), all of which are between a first conductivity-type semiconductor layer 13, and a second conductivity-type semiconductor layer 17. In an implementation, the device may include a greater or smaller number of the quantum well layers 16a and the quantum barrier layers 16b than those illustrated.

The border layer 14 may be in contact with the first conductivity-type semiconductor layer 13, and may be between the first conductivity-type semiconductor layer 13 and the active layer 16. A band gap energy of the border layer 14 may be reduced or may decrease in a direction (e.g., thickness direction). For example, the border layer 14 may have a band gap energy that decreases in a direction away from the first conductivity-type semiconductor layer 13 (e.g., a band gap energy of the border layer 14 may decrease from a portion thereof adjacent to the first conductivity-type semiconductor layer 13 toward the growth blocking layer 15). In an implementation, the border layer 14 may include, e.g., $Al_xIn_yGa_{1-x-y}N$ ($0 \leq x \leq 0.1$, $0.01 \leq y \leq 0.1$). In an implementation, the border layer 14 may include, e.g., InGaN. Maintaining a composition ratio of In at 0.01 or greater may help suppress an agglomeration phenomenon of In. Maintaining a composition ratio of In at 0.1 or less may help prevent an excessive reduction in a band gap energy. For example, a reduction in electronic binding force of the quantum barrier layer 16b may be prevented, and luminous efficiency may be maintained. The border layer 14 may have a thickness of, e.g., 2 nm to 3 nm.

As described above, in a case in which the active layer is formed in such a manner that the quantum well layer 16a (including InGaN) and the quantum barrier layer 16b (including GaN or AlGaN) are alternately stacked, decomposition temperatures of InN and GaN forming InGaN may be significantly different. InGaN could be phase-separated into InN and GaN. In addition, in a case in which the quantum barrier layer 16b (including GaN formed at temperatures of 1,000° C. or higher) on the quantum well layer 16a (including InGaN formed at temperatures of 800° C. or lower) is grown, In incorporated into the quantum well layer 16a by heat could be agglomerated, and an In composition may be non-uniform (localization of In), which could act as a point defect of the quantum well layer 16a. Thus, crystallinity of the quantum barrier layer 16b formed on the quantum well layer 16a could be deteriorated. The point defect could cause a leakage current in the active layer 16, thereby degrading rated characteristics and optical power of the semiconductor light emitting device. The device according to an embodiment may help prevent a degradation of film quality of the active layer 16 in such a manner that the border layer 14 (including In added thereto), is disposed or provided prior to the active layer 16 being formed.

The border layer 14 may have a gradually reduced band gap energy in a direction by adding a dopant (e.g., may have a band gap energy gradient along a thickness direction thereof). In an implementation, the dopant may be added thereto using a continuous method or a discontinuous method.

The continuous method refers to a method of continuously adding the dopant. For example, an amount of the dopant may be gradually increased or decreased in a direction away from the first conductivity-type semiconductor layer 13 (e.g., a dopant amount or concentration gradient may be present in a thickness direction of the border layer 14). In an implementation, the amount of the dopant may be increased and then decreased, or decreased and then increased.

The discontinuous method refers to a method of intermittently adding the dopant. For example, the dopant may be input in a stepwise manner during a specific period of time, and the amount thereof may be increased or decreased in the direction away from the first conductivity-type semiconductor layer 13. In an implementation, the amount of the dopant may be increased and then decreased, or decreased and then increased.

In an implementation, a concentration gradient of the dopant or a profile of band gap energy in the border layer 14 may not be equal to a profile of an addition amount of the dopant. For example, the profile of band gap energy in the border layer 14 may not be angulated in the same manner as that of band gap energy illustrated in FIG. 2, but may be smoothed. In a case in which the dopant is one of the elements included in the quantum well layer 16a, due to diffusion by heat or by a concentration gradient, an element in the quantum well layer 16a that is the same as the dopant may be diffused into the border layer 14 during a growth process of the quantum well layer 16a.

The dopant may be the same as an element included in the quantum well layer 16a. For example, a concentration of a dopant added to the border layer 14 may be lower than a concentration of an element included in the quantum well layer 16a.

For example, when the quantum well layer 16a is an InGaN layer, and the quantum barrier layer 16b is a GaN layer, the dopant added to the border layer 14 may be In (e.g., one of the elements included in the quantum well layer 16a). The composition ratio of In added to the border layer 14 may be lower than a composition ratio of In included in the quantum well layer 16a. In this case, band gap energy of the border layer 14 may be greater than that of the quantum well layer 16a, so that light may not be emitted.

In an implementation, the border layer 14 may further include an area 14a therein, in which an n-type impurity is doped.

A height of the quantum barrier layer 16b may be reduced due to a voltage drop. In order to supplement the reduced height thereof, the n-type impurity having a relatively short diffusion length may be implanted into the quantum barrier layer 16b. Due to implantation of the n-type impurity, the voltage drop of the quantum barrier layer 16b may be reduced, while the electronic binding force of a quantum well structure may be increased.

By the same principle as that described above, in a case in which the n-type impurity is implanted into the border layer 14, the voltage drop of the border layer 14 may be prevented, so that a greater number of electrons may be implanted. Thus, optical power may be further increased.

In an implementation, the n-type impurity further included in the border layer 14 may include, e.g., Si.

In an implementation, a concentration of Si may be, e.g., in a range of $7 \times 10^{17}/cm^3$ to $10^{18}/cm^3$. Maintaining the concentration of Si within the range described above may help ensure that electron implantation efficiency is not decreased, thereby maintaining optical power. The area 14a, in which the n-type impurity is doped in the border layer 14, may have an area greater than or equal to 50% of that of the border layer 14.

The growth blocking layer 15 may be in contact with the border layer 14, and may be between the active layer 16 and the border layer 14. The growth blocking layer 15 may have band gap energy equal to that of the quantum barrier layer 16b, and may include, e.g., $Al_xGa_{1-x}N$ (0≤x<1).

The growth blocking layer 15 may be thinner than the quantum barrier layer 16b. For example, when a thickness of the quantum barrier layer 16b is 4 nm, the growth blocking layer 15 may have a thickness of 0.5 nm to 2.0 nm. Maintaining the thickness of the growth blocking layer 15 at 0.5 nm or greater may help ensure that the growth blocking layer 15 is formed as a single layer in metal-organic chemical vapor deposition (MOCVD), thereby facilitating growth of the border layer 14. Maintaining the thickness of the growth blocking layer 15 at 2.0 nm or less may help ensure that an effect of preventing an In composition of the active layer 16 from being non-uniform by adding In thereto, before the active layer 16 is grown, is not limited.

The growth blocking layer 15 may be between the border layer 14 and the active layer 16. For example, the border layer 14 and the active layer 16 may be grown to be a single semiconductor layer, thereby preventing film quality of the active layer 16 from being degraded. In an implementation, the growth blocking layer 15 may be in contact with the border layer 14 and the quantum well layer 16a of the active layer 16. In an implementation, InGaN may be formed at low temperatures (of 800° C. or lower), thereby having a tendency for film quality thereof to be degraded, as the thickness thereof is increased. Therefore, if the border layer 14 and the quantum well layer 16a, including InGaN, were to contact each other, the border layer 14 and the quantum well layer 16a could be formed as a single InGaN layer, thereby degrading film quality. The growth blocking layer 15 may be interposed between the border layer 14 and the quantum well layer 16a, thereby preventing the border layer 14 and the quantum well layer 16a from being formed as a single InGaN layer. Thus, a degradation of film quality of the quantum well layer 16a may be prevented.

In an implementation, each of the border layer 14 and the growth blocking layer 15 may be formed as a plurality of layers. For example, the device may include at least one border layer 14 and/or at least one growth blocking layer 15. In an implementation, at least one of the growth blocking layers may be interposed between a plurality or pair of border layers, thereby preventing a degradation of film quality of the border layer 14 due to an increase in thickness thereof.

Figure 3:
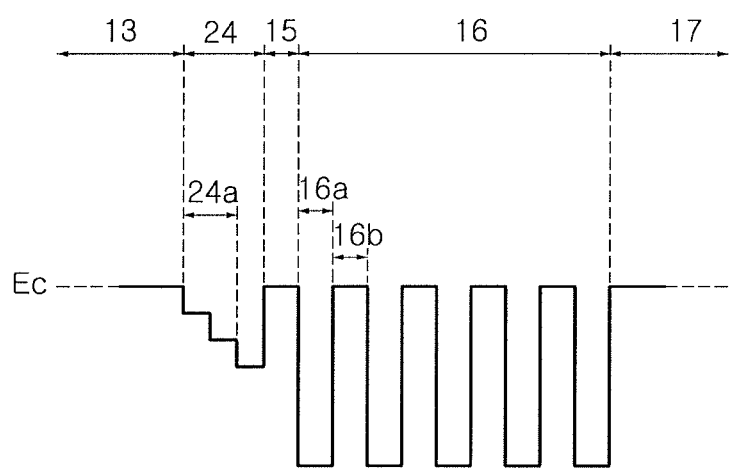
FIGS. 3 to 5 illustrate respective energy band diagrams of energy bands encircling the active layer of a semiconductor light emitting device according to a modified example embodiment.

FIG. 3 illustrates a modified example of an example embodiment and shows a case in which band gap energy of a border layer 24 has a stepwise profile, in a manner different from FIG. 2. Hereinafter, a repeated description overlapping with FIG. 2 will be omitted.

With reference to FIG. 3, the modified example illustrates a case in which, in order to reduce band gap energy of the border layer 24 in a direction moving away from a first conductivity-type semiconductor layer 13, an amount of a dopant added to the border layer 24 may be increased, while the amount of a dopant input thereto may be increased in a stepwise manner in the direction away from the first conductivity-type semiconductor layer 13, so that a profile of band gap energy is reduced in a stepwise manner.

In this case, the border layer 24 may further include an area 24a therein, in which an n-type impurity is doped.

Figure 4:
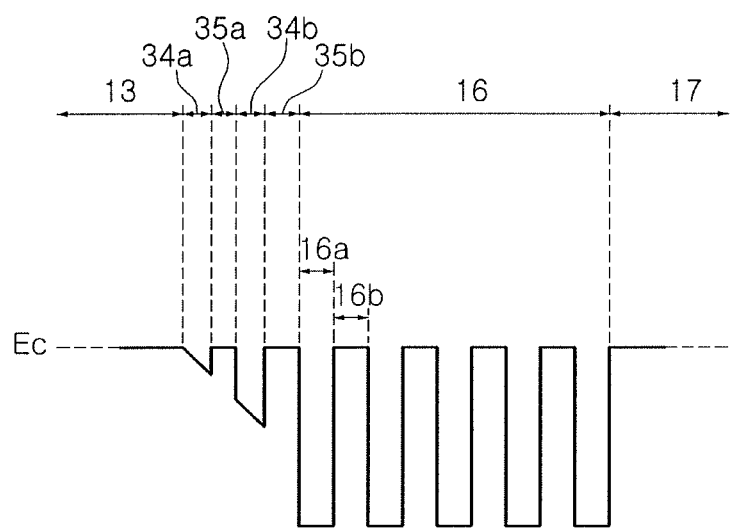

FIG. 4 illustrates a modified example of an example embodiment and shows a case in which a growth blocking layer is disposed in a border layer in a manner different from FIG. 2. A repeated description overlapping with FIG. 2 will be omitted.

With reference to FIG. 4, the modified example illustrates a case in which the border layer includes a first border layer 34a and a second border layer 34b, and the growth blocking layer includes a first growth blocking layer 35a and a second growth blocking layer 35b, while the first growth blocking layer 35a is interposed between the first border layer 34a and the second border layer 34b, thereby preventing a degradation of film quality of the border layer due to an increase in thickness thereof.

In this case, at least one of the first border layer 34a and the second border layer 34b may be doped with an n-type impurity.

Figure 5:
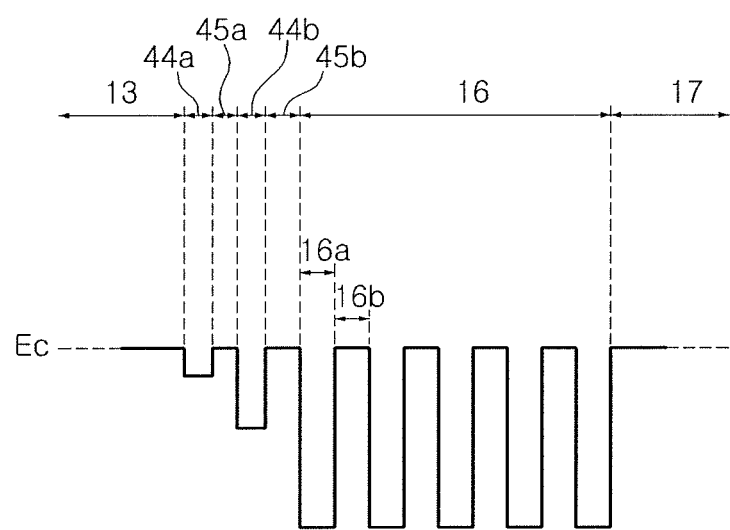

FIG. 5 illustrates a modified example of an example embodiment and shows a case in which a growth blocking layer is disposed in a border layer in a manner different from FIG. 3. A repeated description overlapping with FIG. 3 will be omitted.

With reference to FIG. 5, the modified example illustrates a case in which the border layer includes a first border layer 44a and a second border layer 44b, and the growth blocking layer includes a first growth blocking layer 45a and a second growth blocking layer 45b, and the first growth blocking layer 45a is interposed between the first border layer 44a and the second border layer 44b, thereby preventing a degradation of film quality of the border layer due to an increase in thickness thereof.

In this case, at least one of the first border layer 44a and the second border layer 44b may be doped with an n-type impurity.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Table 1 below illustrates the number of pairs of a quantum well structure in Example Embodiments 1 to 3 and in Comparative Examples 1 to 3. Example Embodiments 1 to 3 included the border layer, while Comparative Examples 1 to 3 had the same structure as that of Example Embodiments 1 to 3, respectively, but did not include the border layer.

TABLE 1

| Classification | Comparative Example 1 | Comparative Example 2 | Comparative Example 3 | Example Embodiment 1 | Example Embodiment 2 | Example Embodiment 3 |
|---|---|---|---|---|---|---|
| No. of Pairs | 5 | 6 | 7 | 5 | 6 | 7 |

EXPERIMENTAL EXAMPLE 1

Figure 6:
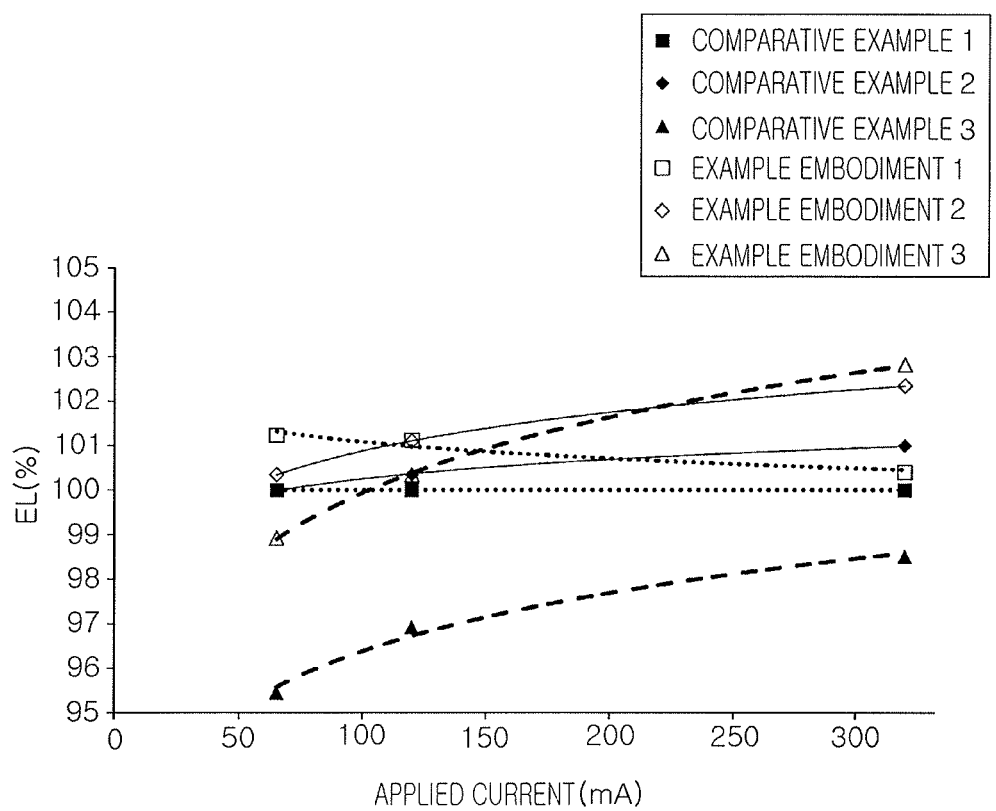
FIG. 6 illustrates a graph comparing relative levels of luminance of Example Embodiments 1 to 3 and Comparative Examples 2 to 3, when luminance of Comparative Example 1 is set as 100%.

FIG. 6 illustrates a graph comparing relative levels of luminance of Example Embodiments 1 to 3 and Comparative Examples 1 to 3 when luminance of Comparative Example 1 is set as 100%.

With reference to FIG. 6, it may be seen that, when a Comparative Example and an Example Embodiment having the same number of pairs are compared, luminance of Example Embodiments of the present disclosure including In added thereto was improved. In this case, improvement in luminance was more significant as the number of pairs of the quantum well structure is increased. Thus, it may be seen that an effect of improving light characteristics by adding In to the border layer was improved as the number of pairs of the quantum well structure increased.

EXPERIMENTAL EXAMPLE 2

Table 2 below illustrates internal quantum efficiency (IQE) of Example Embodiments 1 and 2 and Comparative Examples 1 and 2 according to an applied current.

TABLE 2

| | Applied Current (mA) | | |
|---|---|---|---|
| Classification | 65 | 120 | 410 |
| IQE (%) of Example Embodiment 1 | 89.9 | 86.2 | 71.9 |
| IQE (%) of Example Embodiment 2 | 89.9 | 86.9 | 74.3 |
| IQE (%) of Comparative Example 1 | 90.0 | 86.6 | 72.3 |
| IQE (%) of Comparative Example 2 | 87.6 | 84.5 | 69.6 |

With reference to Table 2, Example Embodiment 1 and Comparative Example 1, in which the number of pairs was 5, had no significant difference in IQE. However, in Example Embodiment 2 and Comparative Example 2, in which the number of pairs was 6, IQE of Example Embodiment 2 was higher than that of Comparative Example 2. Thus, it may be seen that, when the number of pairs is 6 or more, addition of In to the border layer further increased a value of IQE.

EXPERIMENTAL EXAMPLE 3

Table 3 below illustrates a comparison of droop phenomena of Example Embodiments 1 and 2 and Comparative Examples 1 and 2 according to an applied current.

TABLE 3

| | Applied Current (mA) | | |
|---|---|---|---|
| Classification | 65 | 120 | 410 |
| Droop (%) of Example | 3.9 | 7.9 | 23.1 |

TABLE 3-continued

| | Applied Current (mA) | | |
|---|---|---|---|
| Classification | 65 | 120 | 410 |
| Embodiment 1 | | | |
| Droop (%) of Example Embodiment 2 | 2.3 | 5.6 | 19.2 |
| Droop (%) of Comparative Embodiment 1 | 2.1 | 5.7 | 21.3 |
| Droop (%) of Comparative Embodiment 2 | 1.6 | 5.1 | 21.8 |

With reference to Table 3, when an applied current was 65 mA and 120 mA, levels of droop of Example Embodiments were not improved more than those of droop of the Comparative Examples. However, when the applied current was 410 mA, a level of droop of Example Embodiment 1 was not improved more than that of droop of Comparative Example 1, but a level of droop of Example Embodiment 2 was improved more than that of droop of Comparative Example 2. Thus, it may be that, when the number of pairs is 6 or more, and an amount of the applied current is relatively high, addition of In to the border layer improved the droop phenomenon.

EXPERIMENTAL EXAMPLE 4

Figure 7:
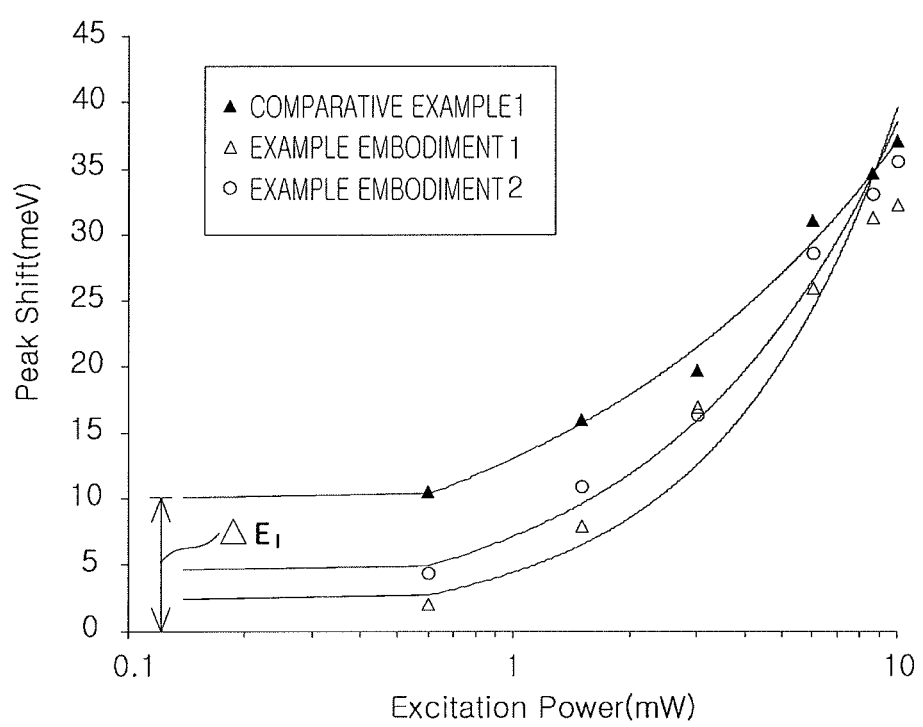
FIG. 7 illustrates a graph showing changes in time-lapsed peak shift values depending on changes in excitation power levels in Example Embodiments 1 and 2 and Comparative Example 1, respectively.

Table 4 below illustrates a comparison of excitation power-independent shift ($\Delta E_1$) values of Example Embodiments 1 and 2 and Comparative Example 1 with reference to FIG. 7. FIG. 7 illustrates a graph showing changes in time-lapsed peak shift values depending on changes in excitation power levels in Example Embodiments 1 and 2 and Comparative Example 1, respectively.

A degree of localization of In may be indirectly determined by measuring a $\Delta E_1$ value obtained by a time-lapsed peak shift experiment.

$\Delta E_1$ may be generated by a carrier localization effect caused by a potential fluctuation of In. Thus, when the $\Delta E_1$ value is relatively low, the degree of localization of In may be relatively low.

In a case in which sufficient In was added to a border layer 14, an In agglomeration phenomenon in an active layer, e.g., an In localization phenomenon, was reduced. In order to reduce the In localization phenomenon in the active layer, the $\Delta E_1$ value may be less than or equal to 5 meV.

TABLE 4

| Classification | $\Delta E_1$ (meV) |
|---|---|
| Example Embodiment 1 | 2.1 |
| Example Embodiment 2 | 4.4 |
| Comparative Example 1 | 10.5 |

With reference to Table 4, $\Delta E_1$ values of Example Embodiments 1 to 2 were less than that of Comparative Example 1. Thus, it may be seen that, when In was added to the border layer, the In agglomeration phenomenon was suppressed, thereby preventing a degradation of film quality of the active layer.

EXPERIMENTAL EXAMPLE 5

Table 5, below, illustrates a comparison of luminance between Example Embodiment 1 and Example Embodiment 4 when luminance of Comparative Example 1 is set as 100%. As described above, Example Embodiment 1 may include only the border layer and Example Embodiment 4 may include the border layer and the growth blocking layer.

TABLE 5

| Classification | Luminance (Relative Value) |
|---|---|
| Example Embodiment 1 | 1.017 |
| Example Embodiment 4 | 1.013 |
| Comparative Example 1 | 1 |

With reference to Table 5, it may be seen that luminance of Example Embodiment 4, including the border layer and the growth blocking layer was increased by 0.4%, compared to Example Embodiment 1, including only the border layer, and was increased by 1.7% compared to Comparative Example 1.

With reference to FIG. 1, a semiconductor light emitting device 10 may include a first electrode 19a on the first conductivity-type semiconductor layer 13 and may include an ohmic contact layer 18 and a second electrode 19b, sequentially disposed on the second conductivity-type semiconductor layer 17.

In an implementation first electrode 19a and the ohmic contact layer 18 may include, e.g., silver (Ag), nickel (Ni), aluminum (Al), rhodium (Rh), palladium (Pd), iridium (Ir), ruthenium (Ru), magnesium (Mg), zinc (Zn), platinum (Pt), gold (Au), or the like, and may have a single layer structure or a multilayer structure. The first electrode 19a may be provided as a contact electrode layer and may include, e.g., chromium (Cr) and/or gold (Au). The first electrode 19a may further include a pad electrode layer on a contact electrode layer. The pad electrode layer may include an Au layer, a tin (Sn) layer, or an Au/Sn layer.

The ohmic contact layer 18 may be variously implemented according to a chip structure. For example, in a case in which the ohmic contact layer 18 has a flip-chip structure, the ohmic contact layer 18 may include Ag. In a case in which the ohmic contact layer 18 has an epi-up structure, the ohmic contact layer 18 may include a transmitting electrode. The transmitting electrode may be either a transparent conductive oxide layer or a nitride layer. For example, the transmitting electrode may include indium tin oxide (ITO), zinc-doped indium tin oxide (ZITO), zinc indium oxide (ZIO), gallium indium oxide (GIO), zinc tin oxide (ZTO), fluorine-doped tin oxide (FTO), aluminum-doped zinc oxide (AZO), gallium-doped zinc oxide (GZO), $In_4Sn_3O_{12}$, or zinc magnesium oxide ($Zn_{(1-x)}Mg_xO$, $0 \le x \le 1$). In an implementation, the ohmic contact layer 18 may include, e.g., graphene. In an implementation, the second electrode 19b may include, e.g., Au, Sn or Au/Sn.

By way of summation and review, a structure in which an active layer is interposed between a first conductivity-type semiconductor layer and a second conductivity-type semiconductor layer may be used. If a degradation of the film quality of an active layer, such as the agglomeration phenomenon of particles, were to occur, when an active layer is grown, the light characteristics of light emitting devices could be deteriorated.

The embodiments may provide a semiconductor light emitting device having improved light characteristics thereof, droop phenomenon, and the like, through inhibition of a degradation of film quality of an active layer.

As set forth above, according to example embodiments of the present disclosure, a semiconductor light emitting device having improved light characteristics, such as luminance, through inhibition of a degradation of film quality of an active layer, may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor light emitting device, comprising:
   a first conductivity-type semiconductor layer;
   a second conductivity-type semiconductor layer;
   an active layer interposed between the first conductivity-type semiconductor layer and the second conductivity-type semiconductor layer, the active layer including at least one quantum well layer and at least one quantum barrier layer that are alternately stacked and form a multiple quantum well structure;
   at least one border layer in contact with the first conductivity-type semiconductor layer and interposed between the first conductivity-type semiconductor layer and the active layer, the at least one border layer having a band gap energy that decreases in a direction away from the first conductivity-type semiconductor layer; and
   at least one growth blocking layer interposed between the active layer and the border layer, the at least one growth blocking layer having a band gap energy equal to a band gap energy of the at least one quantum barrier layer, wherein:
the at least one border layer includes an area which n-type impurity is doped and an other area which n-type impurity is undoped, and
the other area is in contact with the at least one growth blocking layer.

2. The semiconductor light emitting device as claimed in claim 1, wherein the at least one growth blocking layer includes $Al_xGa_{1-x}N$, in which $0 \leq x < 1$.

3. The semiconductor light emitting device as claimed in claim 1, wherein a thickness of the at least one growth blocking layer is in a range of 0.5nm to 2.0nm.

4. The semiconductor light emitting device as claimed in claim 1, wherein:
the at least one border layer and the at least one growth blocking layer are formed as a plurality of border layers and a plurality of growth blocking layers, respectively, and
at least one growth blocking layer of the plurality of growth blocking layers is interposed between two border layers of the plurality of border layers.

5. The semiconductor light emitting device as claimed in claim 1, wherein the at least one border layer includes $Al_xIn_yGa_{1-x-y}N$, in which $0 \leq x \leq 0.1$ and $0.01 \leq y \leq 0.1$.

6. The semiconductor light emitting device as claimed in claim 1, wherein:
the at least one border layer includes a dopant, and
the dopant is an element that is the same as an element included in the quantum well layer.

7. The semiconductor light emitting device as claimed in claim 6, wherein a concentration of the dopant in the at least one border layer is lower than a concentration of the same element included in the quantum well layer.

8. The semiconductor light emitting device as claimed in claim 7, wherein the concentration of the dopant gradually changes in the border layer.

9. The semiconductor light emitting device as claimed in claim 7, wherein the concentration of the dopant discontinuously changes in the border layer.

10. The semiconductor light emitting device as claimed in claim 6, wherein the dopant includes indium (In).

11. The semiconductor light emitting device as claimed in claim 1, wherein the at least one border layer further includes an n-type impurity.

12. The semiconductor light emitting device as claimed in claim 11, wherein:
the n-type impurity includes (Si), and
a concentration of Si in the at least one border layer is in a range of $7 \times 10^{17}/cm^3$ to $10^{18}/cm^3$.

13. A semiconductor light emitting device, comprising:
a substrate;
a first conductivity-type semiconductor layer, an active layer, and a second conductivity-type semiconductor layer, stacked on the substrate;
a border layer interposed between the first conductivity-type semiconductor layer and the active layer, the border layer having a band gap energy that decreases in a direction away from the first conductivity-type semiconductor layer and including $Al_xIn_yGa_{1-x-y}N$, in which $0 \leq x \leq 0.1$ and $0.01 \leq y \leq 0.1$; and
a growth blocking layer interposed between the border layer and the active layer and including $Al_xGa_{1-x}N$, in which $0 \leq x < 1$,
wherein:
the active layer has a structure in which a plurality of quantum barrier layers and a plurality of quantum well layers are alternately stacked, and
the growth blocking layer is thinner than the quantum barrier layers.

14. The semiconductor light emitting device as claimed in claim 13, wherein:
a band gap energy of the growth blocking layer is equal to a band gap energy of the quantum barrier layers.

15. A semiconductor light emitting device, comprising:
a first conductivity-type semiconductor layer;
a second conductivity-type semiconductor layer;
an active layer interposed between the first conductivity-type semiconductor layer and the second conductivity-type semiconductor layer, the active layer including at least one indium-containing quantum well layer and at least one quantum barrier layer that are alternately stacked;
an indium-containing border layer in contact with the first conductivity-type semiconductor layer; and
a GaN-containing growth blocking layer contacting the active layer and the border layer,
wherein:
the border layer includes an area which n-type impurity is doped and an other area which n-type impurity is undoped, and
the other area is in contact with the growth blocking layer.

16. The semiconductor light emitting device as claimed in claim 15, wherein the growth blocking layer has a band gap energy equal to a band gap energy of the at least one quantum barrier layer.

17. The semiconductor light emitting device as claimed in claim 15, wherein the border layer has a band gap energy that decreases in a direction from the first conductivity-type semiconductor layer toward the active layer.

18. The semiconductor light emitting device as claimed in claim 15, wherein:
the growth blocking layer includes $Al_xGa_{1-x}N$, in which $0 \leq x < 1$, and
the border layer includes $Al_xIn_yGa_{1-x-y}N$, in which $0 \leq x \leq 0.1$ and $0.01 \leq y \leq 0.1$.

19. The semiconductor light emitting device as claimed in claim 15, wherein a thickness of the growth blocking layer is in a range of 0.5 nm to 2.0 nm.

* * * * *